United States Patent
Takada et al.

(10) Patent No.: US 6,911,352 B2
(45) Date of Patent: Jun. 28, 2005

(54) SEMICONDUCTOR DEVICE AND METHOD OF MANUFACTURING SAME

(75) Inventors: Takeshi Takada, Kyoto (JP); Naoto Okada, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 76 days.

(21) Appl. No.: 10/626,656

(22) Filed: Jul. 25, 2003

(65) Prior Publication Data

US 2004/0150060 A1 Aug. 5, 2004

(30) Foreign Application Priority Data

Jul. 31, 2002 (JP) .................................. 2002-222454

(51) Int. Cl.$^7$ .................. H01L 21/00; H01L 21/20; H01L 21/31; H01L 27/14; H01L 31/00
(52) U.S. Cl. .................. 438/57; 438/584; 438/758; 257/428; 257/431
(58) Field of Search .................. 438/48, 57, 584, 438/758; 257/428, 431

(56) References Cited

U.S. PATENT DOCUMENTS 5,021,100 A 6/1991 Ishihara et al. ............ 136/249
6,132,585 A * 10/2000 Midorikawa et al. ....... 205/123
6,261,862 B1 7/2001 Hori et al. .................. 438/96
6,291,761 B1 9/2001 Takada et al. .............. 136/244

FOREIGN PATENT DOCUMENTS

| JP | 63-77167 | 4/1988 |
| JP | 2-237172 | 9/1990 |
| JP | 6-21493 | 1/1994 |

* cited by examiner

Primary Examiner—Craig A. Thompson
(74) Attorney, Agent, or Firm—Fitzpatrick, Cella, Harper and Scinto

(57) ABSTRACT

A semiconductor device which is capable of suppressing short-circuit currents caused to flow through defective areas in a first semiconductor layer can be manufactured at high yield, by utilizing a method of manufacturing a semiconductor device including the steps of forming a first semiconductor layer on a substrate, forming a first transparent electroconductive layer on the first semiconductor layer, and forming a second semiconductor layer on the first transparent electroconductive layer, the method further including executing passivation treatment on defects in the first semiconductor layer before the formation of the second semiconductor layer.

21 Claims, 12 Drawing Sheets

SHUNT PASSIVATION

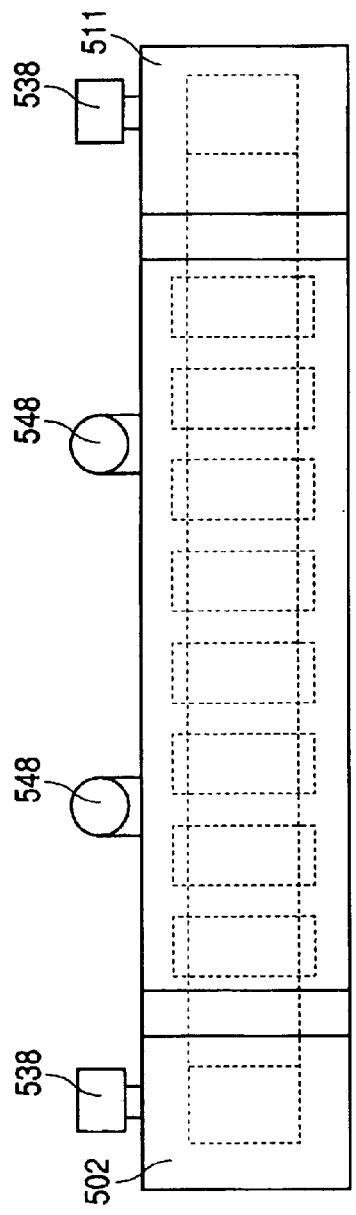
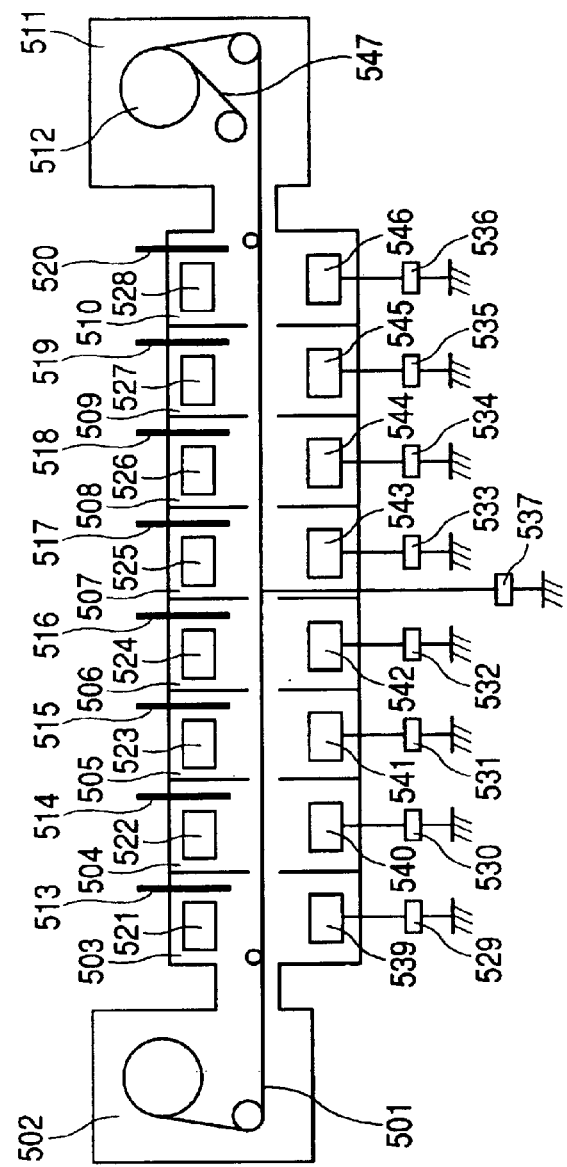
FIG. 5A
FIG. 5B

SEMICONDUCTOR DEVICE AND METHOD OF MANUFACTURING SAME

BACKGROUND OF THE INVENTION

1. Field of the Invention

The present invention relates to a semiconductor device having at least two or more laminated semiconductor layers, e.g., a lamination type photovoltaic device having at least two or more power generation function units.

2. Related Background Art

Photovoltaic devices are devices for converting an incident light energy into an electric energy. Among them, a solar cell serves to convert solar light into an electric energy, and it is required for the solar cell to efficiently convert light having a broad wavelength range. For this reason, in order to attain high conversion efficiency, it is necessary to efficiently absorb light over the whole broad wavelength range. As one of the means for solving this problem, a lamination type photovoltaic device is well known in which photovoltaic devices including semiconductor layers with different band gaps as optical active layers are laminated. In this lamination type photovoltaic device, a photovoltaic device using a semiconductor material having a relatively wide band gap is arranged on the light incidence side in order to absorb light of short wavelengths having a large energy, and a photovoltaic device using a semiconductor material having a relatively narrow band gap is arranged so as to underlie the first photovoltaic device in order to absorb light of long wavelengths having a low energy and having transmitted through the overlying device, whereby light is efficiently absorbed and utilized over a broad wavelength range.

Here, an important point is that it is necessary to introduce light of wavelength ranges suitable for the individual photovoltaic devices into the devices. The reason is that in the individual photovoltaic devices, a utilizable wavelength region of incident light is restricted by the band gap of the semiconductor material used for the optical active layer. That is to say, photons each having an energy lower than the band gap of the semiconductor material are not absorbed by the semiconductor material and are unable to be utilized. On the other hand, photons each having an energy higher than the band gap of the semiconductor material are absorbed. However, since the potential energies of the electrons which can be given when exciting the electrons by the photons are limited by a width (band gap energy) of the band gap, it is impossible to utilize any of differences between the band gap energy and the photon energies. That is to say, for the lamination type photovoltaic device, it is important that only light of a short wavelength region is made incident to the photovoltaic device arranged on the light incident side, while only light of a long wavelength region is made incident to the photovoltaic device underlying that device.

As one of the means for solving this problem, a method is known in which a transparent electroconductive layer is provided as a selective reflection layer between upper and lower photovoltaic devices to be used as a reflection layer. For example, Japanese Patent Application Laid-Open No. 63-77167 discloses a method in which a transparent electroconductive layer for reflecting light of short wavelengths but transmitting light of long wavelengths is provided between photovoltaic devices. In addition, Japanese Patent Application Laid-Open No. 2-237172 discloses a method in which a thickness of the transparent electroconductive layer is adjusted so that a peak of reflectivity thereof corresponds to a maximum wavelength of spectral sensitivity of a photovoltaic device arranged on the light incidence side to increase a current value of the photovoltaic device on the light incidence side. Each of those methods aims at selectively reflecting light of short wavelengths expected to be absorbed by the photovoltaic device on the incident light side to the photovoltaic device on the incident light side by the selective reflective layer to thereby utilize light more efficiently and to enhance the conversion efficiency.

A function of connecting plural devices in series to one another as well as a function of selectively reflecting light is required for that transparent electroconductive layer. In this connection, since the transparent electroconductive later concerned acts as an external resistance in terms of an equivalent circuit, the magnitude of a resistance value directly leads to a decrease in curvature factor. From this respect, high electric conductivity is required for a material of a transparent electroconductive layer.

In general, a transparent electroconductive layer is formed by utilizing a sputtering method. As for a method, two kinds of methods are proposed: a method in which sputtering is carried out in the ambient atmosphere of Ar gas with oxide such as $In_2O_3$—$SnO_2$ or ZnO as a target; and a reactive sputtering method in which alloy such as In—Sn or Zn is sputtered in the ambient atmosphere of mixed gas of Ar and $O_2$. Then, according to the former sputtering method, a film having a low electric resistance and high transmittance can be formed through the sputtering process.

On the other hand, the latter reactive sputtering method has a superior advantage in that a target material can be saved, and production stop time accompanying target exchange can be greatly reduced. Thus, the latter method is suitable for the mass production.

In the lamination type photovoltaic device obtained in such a manner, light is efficiently absorbed over the whole wavelength region of the incident light. Thus, the energy of the incident light can be utilized as much as possible, and hence the high conversion efficiency can be obtained.

However, in the photovoltaic device having a large area such as a solar cell, short-circuit in defective areas of the device becomes a serious problem due to its large area. As an effective means for solving this problem, for example, it is disclosed in Japanese Patent Application Laid-Open No. 6-21493 that defective areas are separated in terms of a circuit by utilizing the fact that a current is very easy to be caused to flow through the short-circuited defective areas as compared with any of normal portions to thereby prevent reduction in conversion efficiency. For example, a processing is given in which a short-circuited portion in a defective area which is already present after formation of a film is removed, or a resistance of a member in the vicinity of the short-circuited portion is increased to passivate any of defective areas, whereby short-circuit currents are prevented from being caused to flow through the defective areas to thereby restrain reduction in conversion efficiency. This processing will hereinafter be referred to as a shunt passivation.

However, in the lamination type photovoltaic device having the transparent electroconductive layer adopted as the selective reflection layer, a problem arises in that the function of restraining reduction of conversion efficiency by the shunt passivation does not function properly. As shown in FIG. 1A, a first transparent electroconductive layer 103 and a second transparent electroconductive layer 105 are formed so as to overlie a defective area 107 in a first semiconductor layer 102 on a substrate 101 and a defective area 106 in a second semiconductor layer 104, respectively.

Since the first transparent electroconductive layer 103 and the second transparent electroconductive layer 105 each have a low resistance and define a planar conduction path, short-circuit currents are caused to flow through the defective areas 106 and 107 of the first semiconductor layer 102 and the second semiconductor layer 104, respectively, to cause reduction of the electromotive force. Hence, when the above-mentioned shunt passivation is carried out (refer to FIG. 1B), a defect in the second semiconductor layer 104 is passivated, but a defect in the first semiconductor layer is not passivated at all. If the operation for generation of an electric power is carried out under this state, as shown in FIG. 2, short-circuit currents caused to flow through a defective region 207 of a first semiconductor layer 202 are two-dimensionally collected to cause reduction of the electromotive force in a normal portion of the first semiconductor layer 202. Thus, this phenomenon causes reduction in conductive efficiency of the whole device.

Even if a transparent electroconductive layer is adopted as a selective reflection layer in order to increase a photoelectric current in such a manner, since any of the defects in the first semiconductor layer is not passivated through the shunt passivation process, a substrate and the first transparent electroconductive layer are short-circuited, and hence the property of the semiconductor layer is deteriorated all the more. As a result, the essential function of the selective reflection layer is not necessarily exhibited fully so that enhancement of the conversion efficiency is insufficient. In particular, when the number of defects present inside the first semiconductor layer is large, the provision of the selective reflection layer may rather cause deterioration of the property of the lamination type photovoltaic device in some cases.

SUMMARY OF THE INVENTION

In the light of the foregoing, the present invention has been made in order to solve the above-mentioned problems associated with the prior art, and hence the present invention provides a semiconductor device which is capable of suppressing short-circuit currents caused to flow through defective areas in a semiconductor layer, and a method of manufacturing the same. The present invention is applied to a photovoltaic device of semiconductor devices, and thus aims at providing a photovoltaic device which is capable of enhancing an essential function of a transparent electroconductive layer as a selective reflection layer, and of having a large photoelectric current without accompanying reduction of an electromotive force to have high conversion efficiency.

For the purpose of solving the above-mentioned problems, we made examination for passivating any of defects in the first semiconductor layer.

Therefore, according to an aspect of the present invention, a method of manufacturing a semiconductor device includes at least:

forming a first semiconductor layer on a substrate;

forming a first transparent electroconductive layer on the first semiconductor layer; and forming a second semiconductor layer on the first transparent electroconductive layer, and the method further includes executing passivation treatment on defects in the first semiconductor layer before formation of the second semiconductor layer.

Further, according to another aspect of the present invention, a method of manufacturing a semiconductor device includes at least:

forming a first semiconductor layer on a substrate;

forming a first transparent electroconductive layer on the first semiconductor layer;

forming a second semiconductor layer on the first transparent electroconductive layer; and forming a second transparent electroconductive layer on the second semiconductor layer, and the method further includes:

executing passivation treatment on defects in the first semiconductor layer before formation of the second semiconductor layer; and executing passivation treatment on defects in the second semiconductor layer.

Further, according to another aspect of the present invention, a method of manufacturing a semiconductor device includes the steps of:

forming a first semiconductor layer on a substrate;

forming a first transparent electroconductive layer on the first semiconductor layer; and forming a second semiconductor layer on the first transparent electroconductive layer; in this order, wherein the step of forming the first transparent electroconductive layer is carried out by the process comprising the steps of:

charging the substrate having the first semiconductor layer thereon to a negative potential;

applying ions to a sputtering target while the substrate is charged to the negative potential; and forming a sputtering film on the first semiconductor layer as a first transparent electroconductive layer.

Further, according to another aspect of the present invention, a semiconductor device includes at least:

a substrate;

a first semiconductor layer formed on the substrate and having defective areas;

a first transparent electroconductive layer formed on areas other than the defective areas of the first semiconductor layer; and a second semiconductor layer formed on the first transparent electroconductive layer.

According to the method of manufacturing a semiconductor device, it is preferable that the treatment for passivating defects in the first (second) semiconductor layer is:

by utilizing a sputtering method adapted to control a bias potential of a substrate, to form the first (second) electroconductive layer only on areas other than the defective areas in the first (second) semiconductor layer;

after formation of the first (second) transparent electroconductive layer, to passivate the first (second) electroconductive layer overlying the defective areas in the first (second) semiconductor layer; or after formation of the first (second) transparent electroconductive layer by utilizing a sputtering method adapted to control a bias potential of a substrate, to passivate the first (second) electroconductive layer overlying the defective areas in the first (second) semiconductor layer.

Further, according to the method of manufacturing a semiconductor device, it is preferable that:

the first transparent electroconductive layer overlying the defective areas in the first semiconductor layer is passivated by increasing a resistance thereof or by removal; and the first transparent electroconductive layer overlying the defective areas in the first semiconductor layer is passivated by applying a voltage or by applying a voltage to the substrate while the substrate is dipped into electrolyte.

Further, according to the method of manufacturing a semiconductor device, it is preferable that by the sputtering method adapted to control a bias potential of a substrate, a voltage is applied from a first power supply to a target, and a voltage is applied from a second power supply to the substrate, to control the bias potentials independently of each other.

According to the method of manufacturing a semiconductor device of the present invention, since any of defects in the semiconductor layer can be passivated, it is possible to suppress short-circuit currents caused to flow through defects. This method of manufacturing a semiconductor device is applied to the manufacture of a photovoltaic device, whereby the effect of a lamination type photovoltaic device can be utilized as much as possible, and hence it is possible to provide a lamination type photovoltaic device which is excellent in yield and is low in cost.

Other features and advantages of the present invention will be apparent from the following description taken in conjunction with the accompanying drawings.

BRIEF DESCRIPTION OF THE DRAWINGS

FIGS. 5A and 5B are schematic views each showing a manufacturing system for forming a transparent electroconductive layer of Example 1 of the present invention;

DESCRIPTION OF THE PREFERRED EMBODIMENTS

Figure 1A:
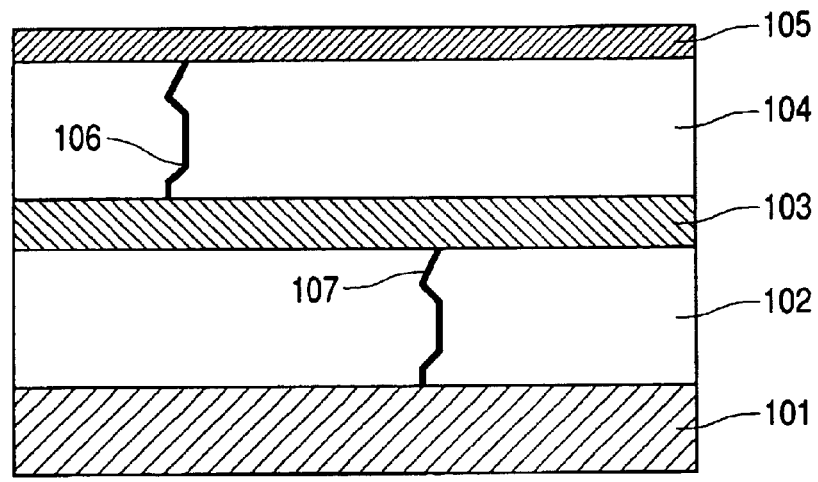
FIG. 1A is a cross sectional view of a conventional lamination type photovoltaic device.
Figure 1B:
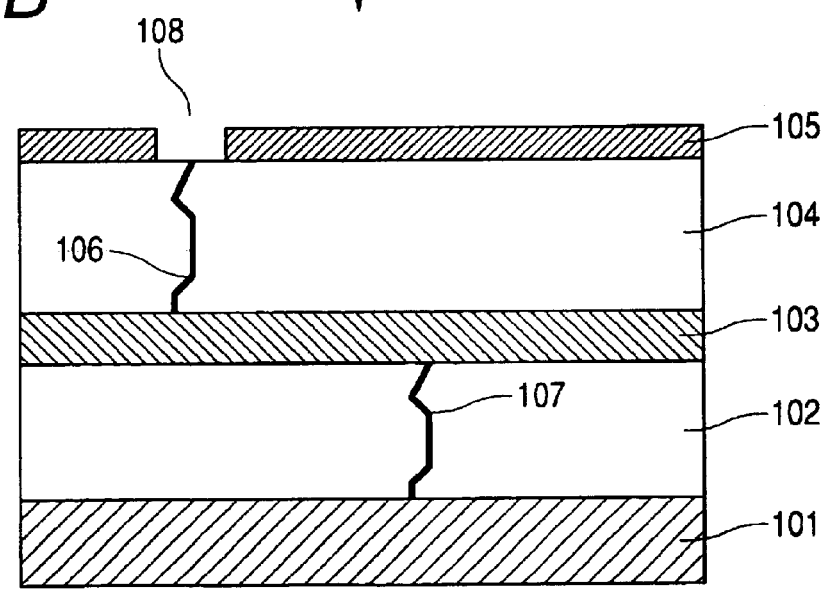
FIG. 1B is a cross sectional view showing the conventional lamination type photovoltaic device shown in FIG. 1A for which shunt passivation is carried out.
Figure 2:
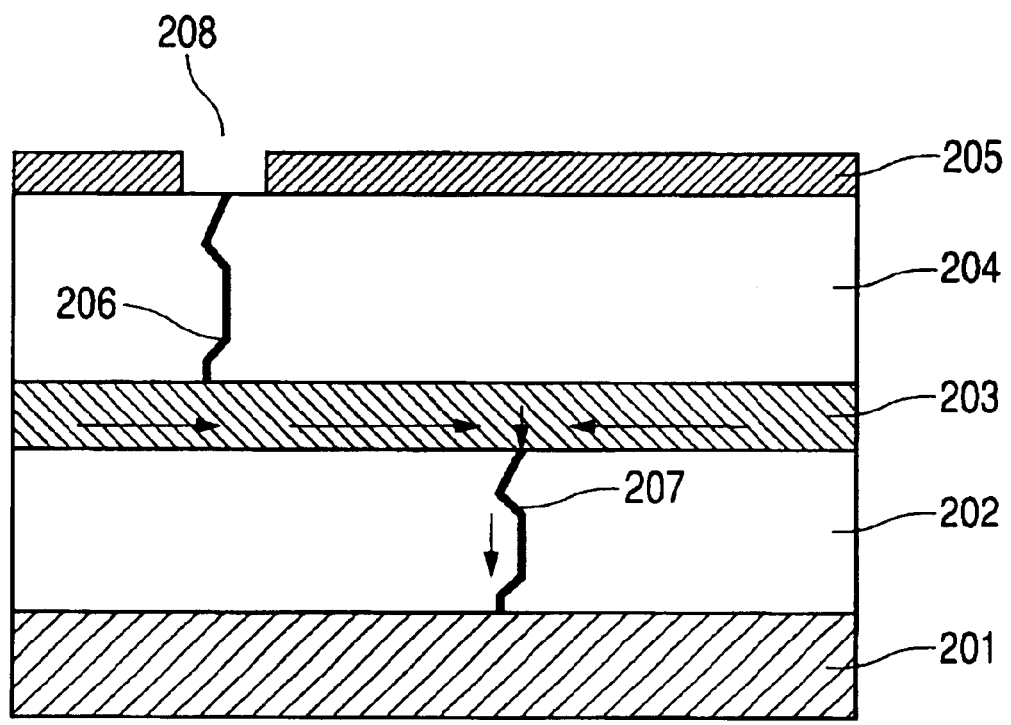
FIG. 2 is a cross sectional view of the conventional lamination type photovoltaic device during power generation.

The present inventor has found out that a photovoltaic device is capable of suppressing any of short-circuit currents caused to flow through defects to have high conversion efficiency, in case where the photovoltaic device is manufactured by utilizing a semiconductor device manufacturing method including: forming at least a first semiconductor layer on a substrate; forming a first transparent electroconductive layer on the first semiconductor layer; and forming a second semiconductor layer on the first transparent electroconductive layer, in which before formation of the second semiconductor layer, any of defects in the first semiconductor layer is subjected to a passivation treatment, or a semiconductor device manufacturing method including: forming at least a first semiconductor layer on a substrate; forming a first transparent electroconductive layer on the first semiconductor layer; forming a second semiconductor layer on the first transparent electroconductive layer; and forming a second transparent electroconductive layer on the second semiconductor layer, in which before formation of the second semiconductor layer, any of defects in the first semiconductor layer is subjected to a passivation treatment, and any of defects in the second semiconductor layer is subjected to a passivation treatment.

Any of defects in the first semiconductor layer can be passivated through a treatment of forming the first transparent electroconductive layer only on portions other than defective areas in the first semiconductor layer by utilizing a sputtering method adapted to control a bias potential of the substrate.

External power supplies which are independent of each other are provided for a target and the substrate which are arranged so as to oppose each other in a vacuum vessel used herein. Then, reactive gas ($O_2$) is introduced into the vacuum vessel, and a suitable voltage is applied from the first power supply to the target so that a self-bias voltage generated in the substrate falls within the range of −20 V to 0 V. Subsequently, a suitable voltage is applied from the second power supply to the substrate so that a bias potential in the range of −110 V to −20 V is generated in the substrate to start formation of a film.

Note that, the actual film formation is carried out while the suitable voltages are applied to the target and the substrate, respectively. Thus, the suitable voltages may be applied to the target and the substrate from the beginning, respectively, as long as such a condition is met that the self-bias potential of the substrate falls within the range of −20 V to 0 V while the voltage is applied to only the target, and also the bias potential of the substrate falls within the range of −110 V to −20 V while the voltages are applied to the target and the substrate, respectively.

Here, while the self-bias potential of the substrate is in the range of −20 V to 0 V, since it is changed depending on a ratio in size between the film formation chamber and the substrate to be used, it may be selected under the condition fitted to the manufacturing conditions. In addition, while the bias potential during the film formation is in the range of −110 V to −20V, an optimal condition is determined based on the voltage applied to the target, and a distance between the substrate and the target. Therefore, such a bias potential may be selected in accordance with the optimal condition.

Figure 3A:
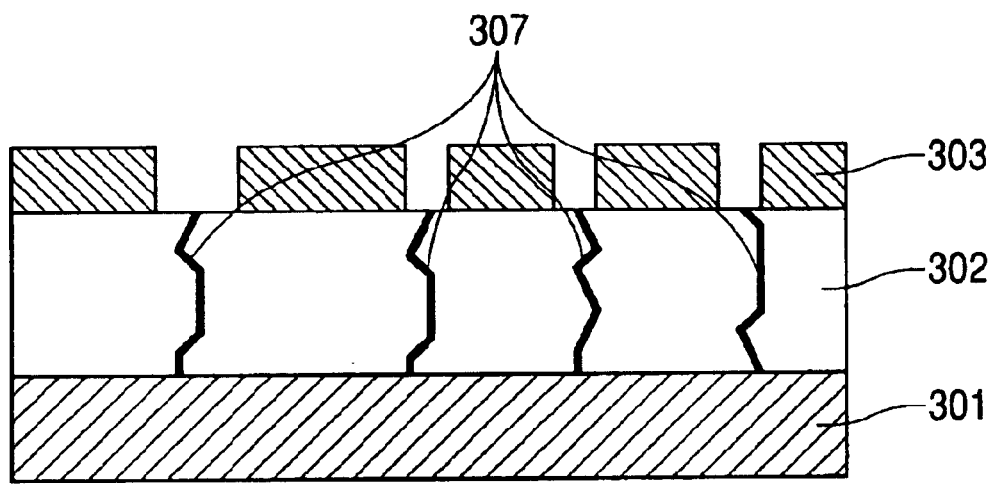
FIG. 3A is a schematic view useful in explaining a sputtering method of forming a transparent electroconductive layer according to the present invention.
Figure 3B:
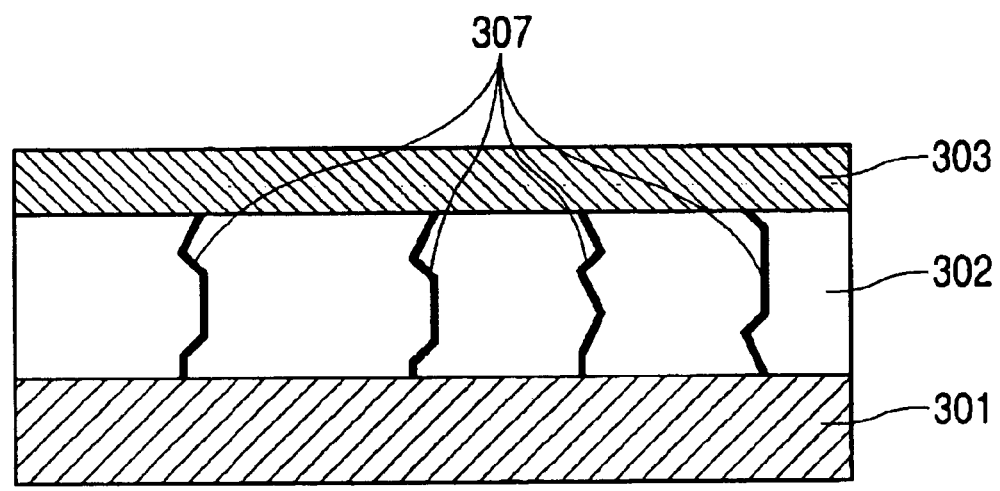
FIG. 3B is a schematic view useful in explaining a conventional sputtering method of forming a transparent electroconductive layer.

According to the sputtering method of the present invention, a transparent electroconductive layer is formed on portions other than defective areas. This reason will now be described with reference to FIGS. 3A and 3B. FIG. 3A schematically shows a sputtering method of the present invention, and FIG. 3B schematically shows a conventional sputtering method.

When a transparent electroconductive layer 303 is formed by utilizing the conventional sputtering method, since no bias potential is applied to a substrate 301 unlike the present invention, the transparent electroconductive layer is uniformly formed irrespective of a defective area 307 and a non-defective area.

On the other hand, when the transparent electroconductive layer is formed by utilizing the sputtering method of the present invention, since a bias potential is applied to the substrate 301, the minus electric charges are concentrated in defective areas 307. Then, $Ar^+$ ions (plus ions) selectively strike the defective areas 307. As a result, atoms of the transparent electroconductive material overlying the defective areas 307 are readily flicked away. Thus, the transparent electroconductive layer is formed only on portions other than the defective areas by utilizing the sputtering method of the present invention.

Here, forming the transparent electroconductive layer only on portions other than the defective areas means that no transparent electroconductive film is formed on any of the defective areas at all, or even if the transparent electroconductive film is formed on the defective areas to some extent, a thickness of the transparent electroconductive film overlying the defective areas is much smaller than that of the transparent electroconductive film overlying portions other than the defective areas. More specifically, in the characteristics of the lamination type photovoltaic device, the characteristics have a shunt dark resistance (RshDK) equal to or larger than 80 $k\Omega \cdot cm^2$.

As described above, the defects in the first semiconductor layer can be passivated by utilizing the sputtering method adapted to control the bias potential of the substrate.

Before formation of the second semiconductor layer, the first transparent electroconductive layer overlying the defective area portions of the first semiconductor layer is treated to increase the resistance value thereof or removed, whereby it is possible to passivate any of the defects in the first semiconductor layer. The removal or increasing of the resistance of the first transparent electroconductive layer, for example, can be made by use of the Joule heat which is generated by applying a suitable voltage to the semiconductor device to cause currents to concentratedly flow through short-circuited portions. Alternatively, the removal or increasing of the resistance of the first transparent electroconductive layer may also be made by dipping the semiconductor device into electrolyte and applying a suitable voltage thereto (electrolytic passivation). The electrolyte is hydrochloric acid, nitric acid or sulfuric acid having such concentration as not to readily dissolve the transparent electroconductive layer, acid of $AlCl_3$, $ZnCl_2$, $SnCl_4$, $SnCl_2$, $TiCl_4$ or the like having such concentration, alkali solution of potassium hydroxide, sodium hydroxide or the like, or metallic salt solution. As for the metallic salt concerned, such a salt is used that contains metal, which constitutes the salt, having a negative standard electrode potential and a hydrogen overvoltage having a value smaller than an absolute value of the standard electrode potential. More specifically, aluminium chroride, magnesium salfate, sodium chloride, or the like is given. Preferably, the applied voltage falls within the range of 2 to 7 V.

In addition, it is preferable, from a respect that any of the defects in the first semiconductor layer is more surely passivated, that after the first transparent electroconductive layer has been formed on only portions other than the defective areas by utilizing the sputtering method adapted to control the bias potential of the substrate, the removal or increasing of the resistance of the first transparent electroconductive layer overlying the defective areas of the first semiconductor layer is carried out. Even if a very small quantity of transparent electroconductive layer is left in any of the defective areas after completion of the process of the sputtering method adapted to control the bias potential of the substrate, it can be sufficiently removed by the electrolytic passivation, and thus RshDK is improved up to about 450 $k\Omega \cdot cm^2$.

From the above-mentioned operation, the shunt dark is improved for the lamination type photovoltaic device in which any of the defects in the first semiconductor layer is passivated. Thus, it is possible to obtain a lamination type photovoltaic device having excellent characteristics, i.e., high yield.

Note that, the above-mentioned treatment of passivating the defects in the first semiconductor layer (the sputtering method adapted to control the bias potential of the substrate, or the removal or increasing of the resistance of the first transparent electroconductive layer overlying the defective areas) may be carried out independently or in combination form by giving consideration to the required characteristics, the circumstances of a construction of the manufacturing system, the cost and the like.

Defects in the second semiconductor layer can be passivated similarly.

Note that, the substrate constituting the semiconductor device includes a metallic substrate, a glass substrate having a surface subjected to the electroconduction treatment, or the like. For example, a stainless substrate such as SUS430, a glass substrate having an electroconductive film such as an ITO (Indium Tin Oxide) film formed on a surface thereof, or the like is given.

Preferred examples of the invention will hereinafter be described in detail with reference to the accompanying drawings. However, it should be noted that the present invention is not intended to be limited thereto in any way.

The examples of the present invention will now be described by giving a photovoltaic device as an example of a semiconductor device.

Figure 4:
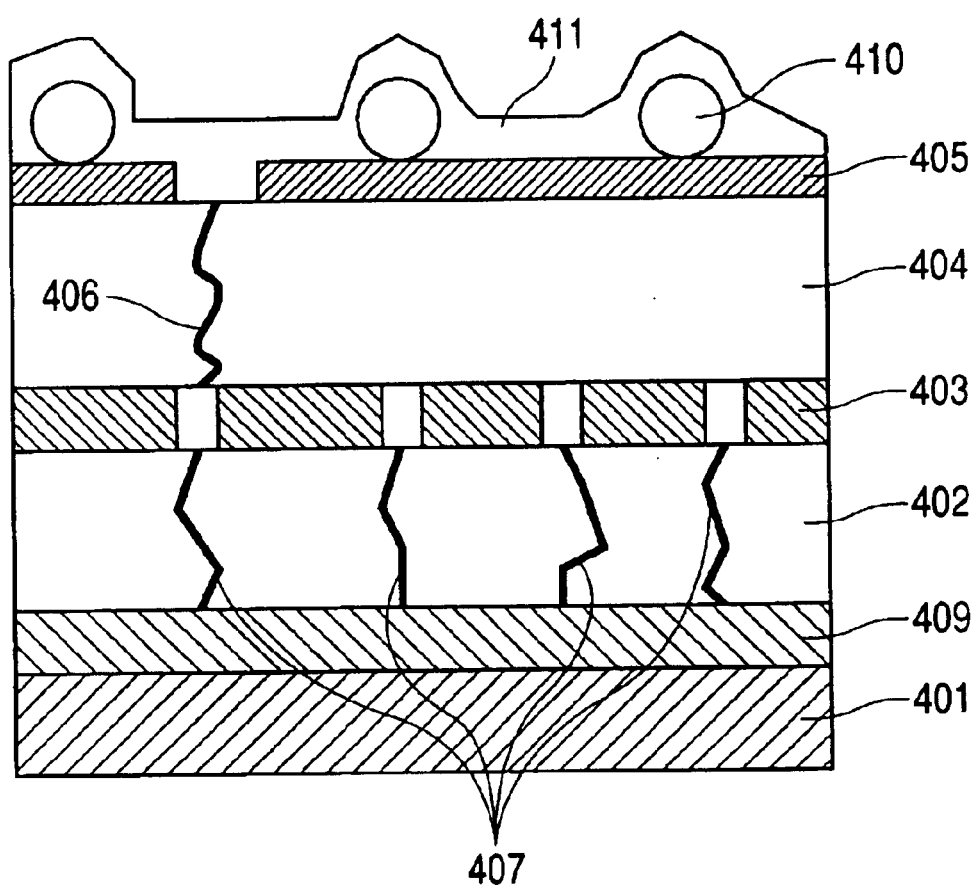
FIG. 4 is a cross sectional view of a lamination type photovoltaic device according to the present invention.

In a lamination type photovoltaic device manufactured in accordance with each of the examples, as shown in FIG. 4, an electroconductive substrate is used as a substrate 401, a first semiconductor layer 402 is formed over the substrate 401 through a reflection layer 409, and a first transparent electroconductive layer 403, a second semiconductor layer 404, and a second transparent electroconductive layer 405 are formed thereon. However, while only an outline is shown in the figure, in order that the photovoltaic device may efficiently function as a solar cell, preferably, the photovoltaic device has a collector electrodes 410 for collecting electricity, and a protection layer 411 with which a surface of the photovoltaic device is covered. Note that, reference numeral 406 designates a defect in the second semiconductor layer, and reference numeral 407 designates a defect in the first semiconductor layer.

EXAMPLE 1

In this example, the lamination type photovoltaic device was manufactured while a bias potential of the substrate was set to −70 V by using a system shown in FIGS. 5A and 5B. Incidentally, FIG. 5A is a plan view of the system, and FIG. 5B is a cross sectional view showing an inner construction of the system.

A roll-like substrate 501 having the reflection layer and the first semiconductor layer formed thereon was placed in a substrate delivery chamber 502 and then was made to pass through film forming chambers 503, 504, 505, 506, 507, 508, 509 and 510 to be fixed to a roll 512 in a substrate winding chamber 511. The size of the substrate 501 is 356 mm in width, 0.15 mm in thickness, and is 800 m in length.

Note that, in FIG. 4, the electroconductive substrate 401 is formed of SUS430 having a surface on which irregularity was left by dull finishing, the reflection layer 409 was formed of an aluminium layer, and the first semiconductor layer 402 was formed of a lamination body which was obtained by laminating an n type a-Si layer, an i type μC—Si layer and a p type μC—Si layer in turn from the substrate side.

Subsequently, vacuum pumps 548 were activated to exhaust air until a pressure become equal to or lower than 0.1 Pa. Thereafter, argon gas was supplied as inactive gas at 45 sccm to the film forming chambers 503, 504, 505, 506, 507, 508, 509 and 510 through gas supply tubes 513, 514, 515, 516, 517, 518, 519 and 520, respectively. Under this state, an opening of an exhaust valve (not shown) was adjusted so that a pressure in the vacuum chamber was held at 0.3 Pa.

However, heater units 521, 522, 523, 524, 525, 526, 527 and 528 each having a set of six infrared ray lamps of 100 W were provided together with the reflection plates each made of stainless in the film forming chambers 503, 504, 505, 506, 507, 508, 509 and 510, respectively. Then, a thermo couple was made in contact with a back surface of the substrate opposite to a film formation surface thereof and under this state, the substrate was heated so that a temperature of the substrate became 200° C. by controlling the temperature. The inner area of each film forming chamber is about 360 mm×680 mm, and the distance between the substrate and a target was 55 mm.

Subsequently, reactive gas ($O_2$) was introduced, a voltage of −600 V was applied to the target arranged so as to oppose the substrate, and suitable voltages were applied to the substrate 501 by independent external power supplies 529, 530, 531, 532, 533, 534, 535, 536 and 537, respectively, so that a self-bias potential of −70 V was generated in the substrate. Then, servo motors 538 were activated to rotate the winding roll 512 to start conveyance of the substrate 501.

The substrate 501 was successively passed through the film forming chambers 503, 504, 505, 506, 507, 508, 509 and 510. At this time, the electric powers were respectively supplied from the external power supplies 529, 530, 531, 532, 533, 534, 535, 536 and 537 to the film forming chambers 503, 504, 505, 506, 507, 508, 509 and 510 using zinc targets 539, 540, 541, 542, 543, 544, 545 and 546 each having a purity of 99.99 weight % and a size of 40 cm×25 cm to induce argon plasm to form a ZnO film (first transparent electroconductive layer) on the substrate. More specifically, since the self-bias potential of −70 V is generated in the substrate, the minus electric charges were concentrated in the defective areas 407 in the first semiconductor layer, and $Ar^+$ ions selectively strike the defective areas 407. As a result, atoms of the transparent electroconductive material overlying the defective areas 407 are flicked away, and thus the transparent electroconductive layer becomes difficult to be formed so as to overlie the defective areas 407, but the transparent electroconductive layer is formed on areas other than the defective areas 407.

The substrate 501 on which a ZnO layer had been formed as the first transparent electroconductive layer was wound in the substrate winding chamber 511. At this time, in order to prevent the surface of the substrate from being damaged, an interleaf 547 made of a polyester film was sandwiched between the substrates.

An n type a-Si layer, an i type a-Si layer and a p type μC—Si layer were successively laminated as a second semiconductor layer on the resultant substrate, and an ITO layer was formed as a second transparent electroconductive layer. Then, a roll was cut into parts each having a size of 356 mm×240 mm by a cutter.

Next, the resultant substrate was dipped into nitric acid (pH=3), and under this state, a voltage of 3.5 V was applied in the form of pulses (25 msec×100) to the substrate to thereby etch away shunt portions of the second semiconductor layer and the second transparent electroconductive layer. Thereafter, collector electrodes were stuck on the substrate which was in turn covered with acrylic urethane to thereby manufacture the lamination type photovoltaic device.

Figure 6:
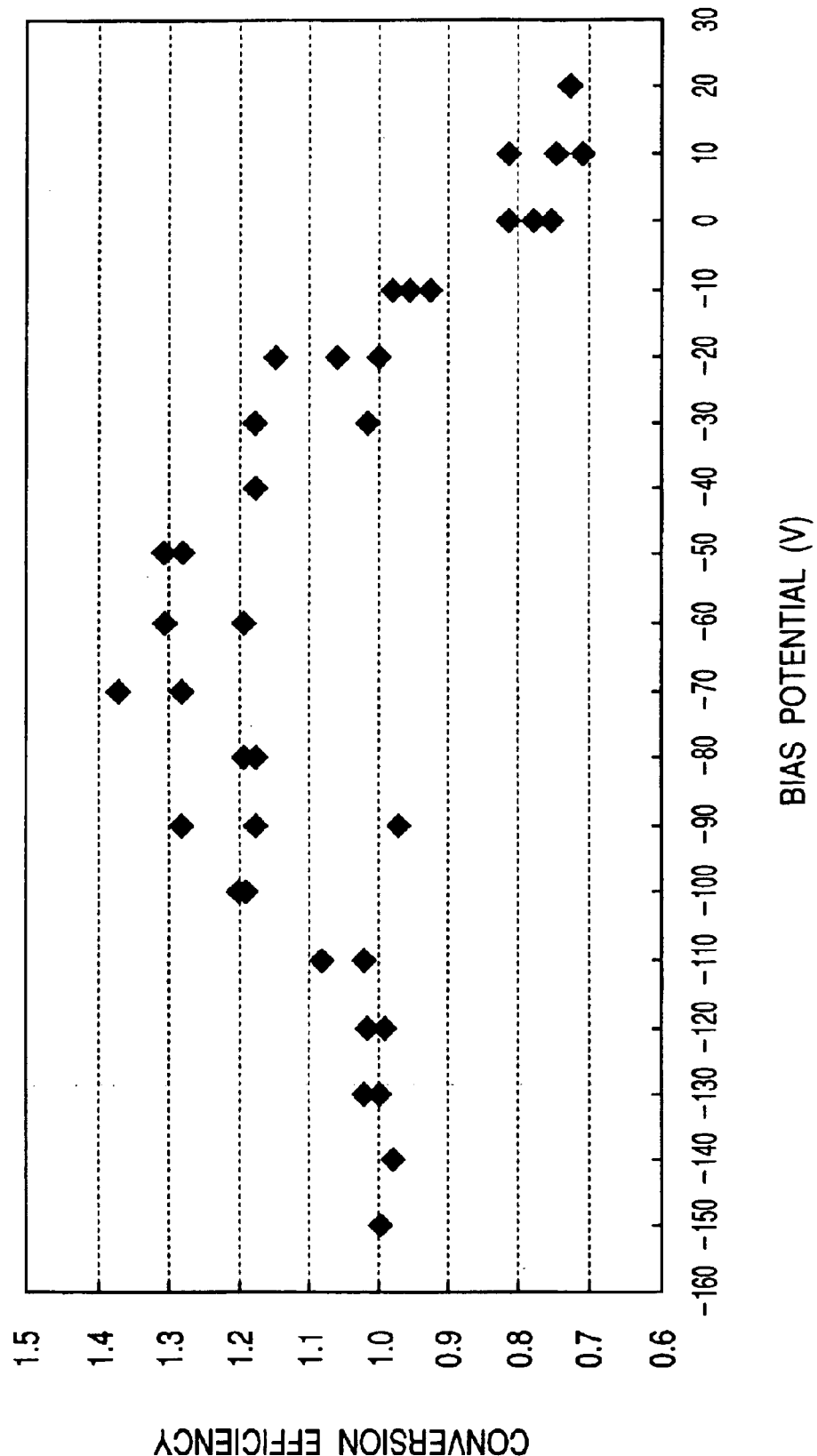
FIG. 6 is a graph showing the results of conversion efficiency characteristics of a lamination type photovoltaic device when a transparent electroconductive layer is formed by utilizing a reactive sputtering method of Example 1 of the present invention.
Figure 7:
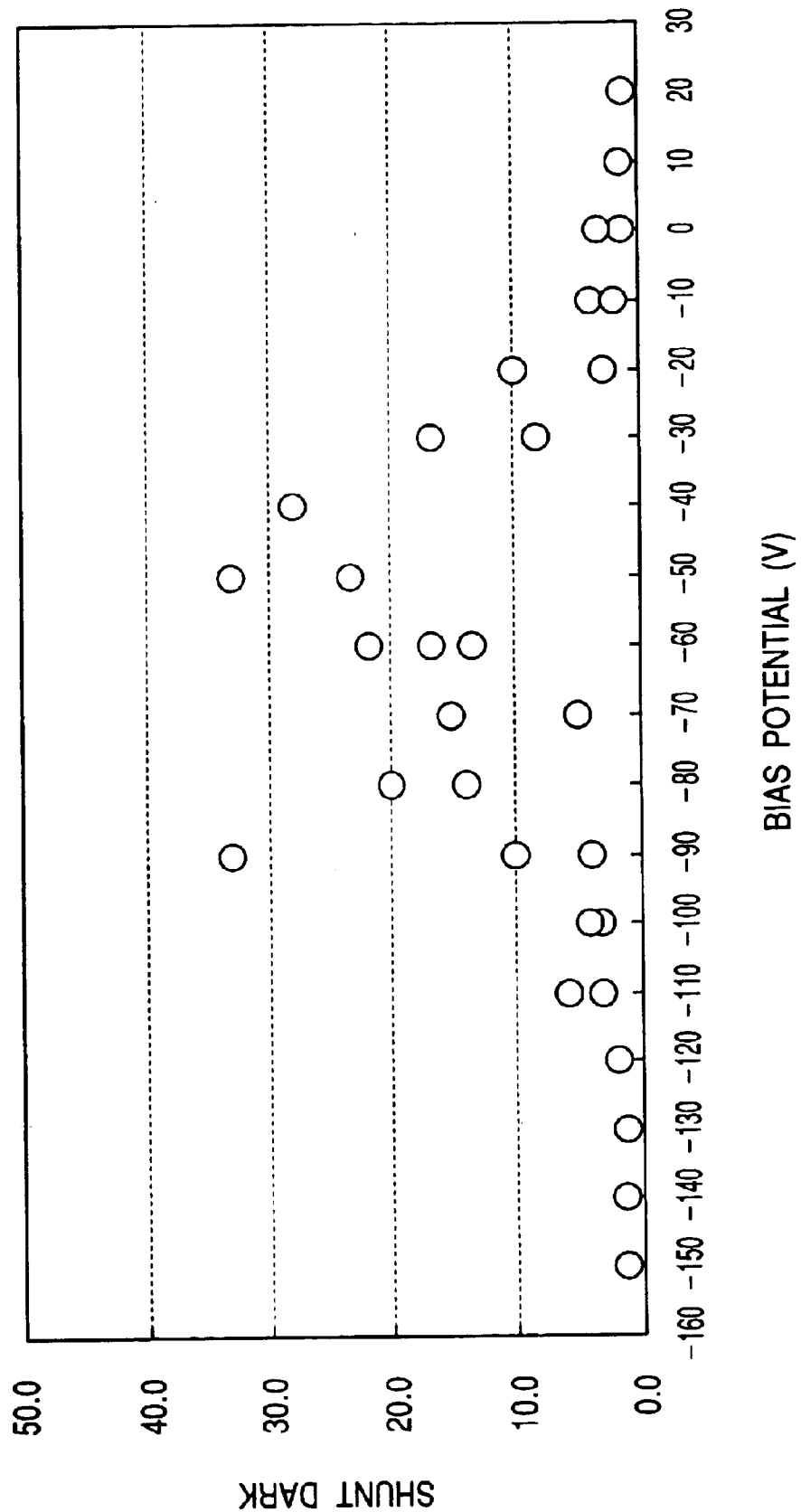
FIG. 7 is a graph showing the results of shunt dark characteristics of a lamination type photovoltaic device when a transparent electroconductive layer is formed by utilizing a reactive sputtering method of Example 1 of the present invention.

Then, the characteristics of the lamination type photovoltaic device were measured. Thereafter, the bias potential of the substrate during the sputtering was changed in the range of −150 V to 20 V to thereby similarly manufacture the lamination type photovoltaic device. Then, the characteristics of the lamination type photovoltaic device were measured. The conversion efficiency characteristics thus obtained, and the results of the shunt dark (RshDK) characteristics are shown in FIGS. 6 and 7, respectively. Note that, FIG. 6 shows relative values obtained when the conversion efficiency in case of the bias potential of −150 V is taken as 1, and FIG. 7 shows relative values obtained when the shunt dark in case of the bias potential of −150 V is taken as 1.

From the conversion efficiency characteristics of FIG. 6, and the results of the shunt dark characteristics of FIG. 7, it is understood that the range of −110 V to −20 V is the satisfactory range for the self-bias potential to be applied to the substrate.

From the foregoing, it is understood that the implementation of the method of manufacturing the first transparent electroconductive layer according to the present invention enhances the conversion efficiency of the lamination type photovoltaic device.

EXAMPLE 2

This example is different from Example 1 in that an oxide target made of zinc oxide (zinc oxide target having a purity of 99.99 weight %, and a size of 40 cm×25 cm) was used as the target in the system shown in FIGS. 5A and 5B, and the first transparent electroconductive layer was formed without introducing reactive gas by utilizing the non-reactive sputtering method.

Similarly to Example 1, the first transparent electroconductive layer was formed while the bias potential was changed in the range of −150 V to 20 V to manufacture the lamination type photovoltaic device.

Figure 8:
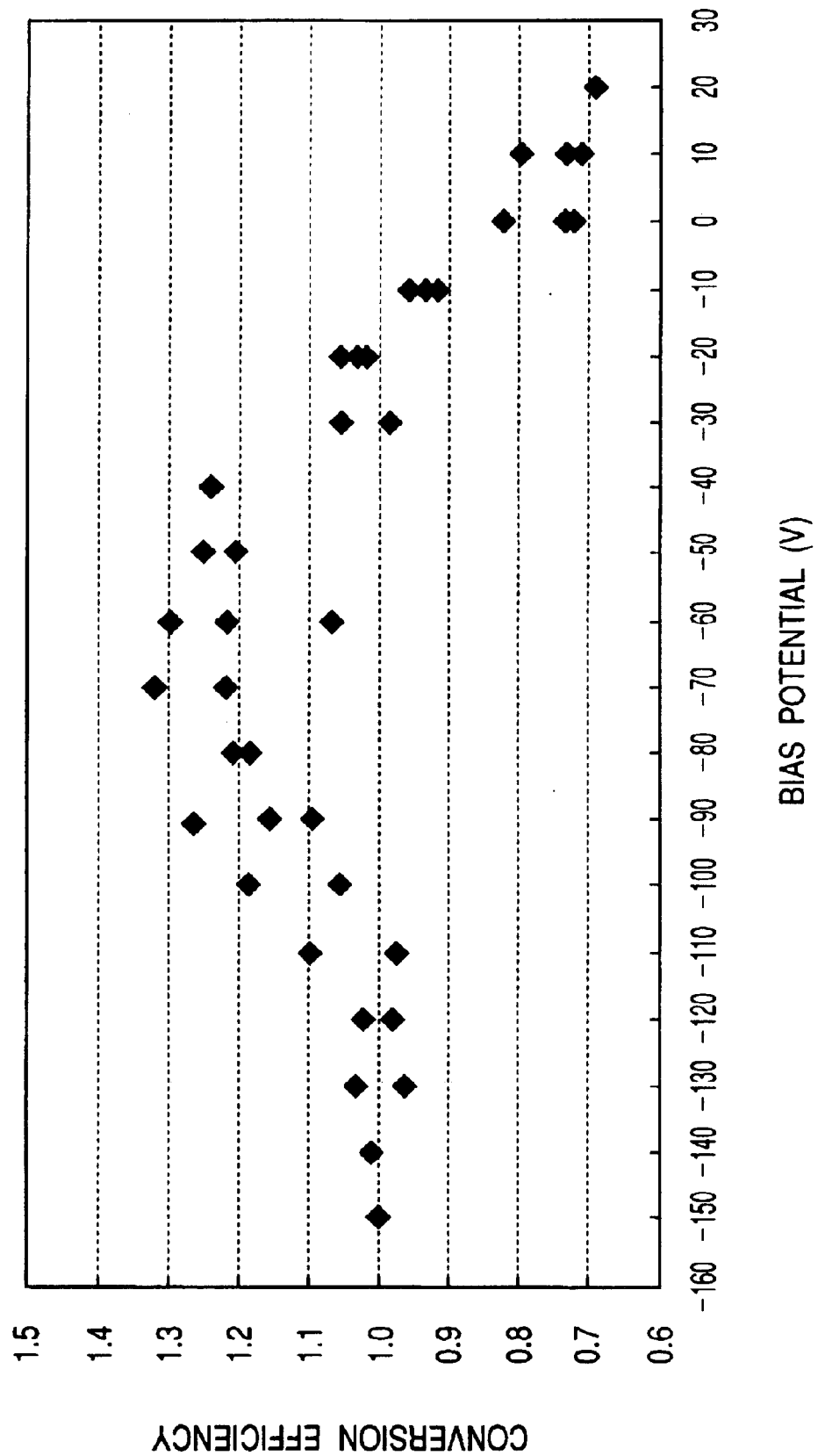
FIG. 8 is a graph showing the results of conversion efficiency characteristics of a lamination type photovoltaic device when a transparent electroconductive layer is formed by utilizing a non-reactive sputtering method of Example 2 of the present invention.
Figure 9:
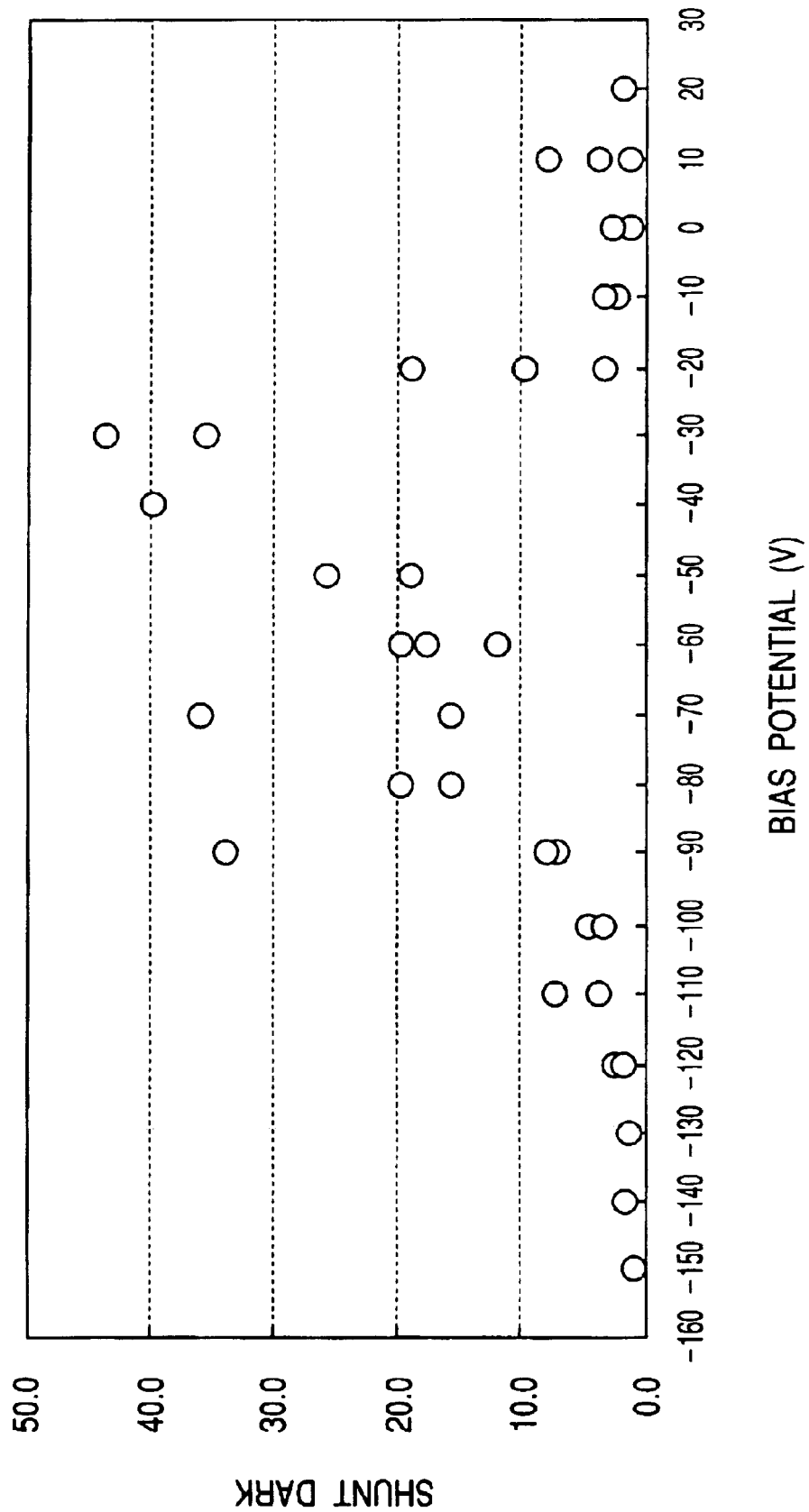
FIG. 9 is a graph showing the results of shunt dart characteristics of a lamination type photovoltaic device when a transparent electroconductive layer is formed by utilizing a non-reactive sputtering method of Example 2 of the present invention.

Then, the characteristics of the lamination type photovoltaic device were measured, and comparisons were made between the characteristics obtained when the bias potential of the substrate was changed in the range of −150 V to 20 V. Then, the resultant conversion efficiency characteristics, and the results of the shunt resistance of dark (RshDK) characteristics are shown in FIGS. 8 and 9, respectively. Note that, FIG. 8 shows relative values obtained when the conversion efficiency in case of the bias potential of −150 V is taken as 1, and FIG. 9 shows relative values obtained when the shunt dark in case-of the bias-potential of −150 V is taken as 1.

From the conversion efficiency characteristics of FIG. 8 and the results of the shunt dark resistance characteristics of FIG. 9, it is understood that the range of −110 V to −20 V is the satisfactory range for the self-bias potential to be applied to the substrate. These results are the same as those of Example 1.

From the foregoing, it is understood that the implementation of the method of manufacturing the first transparent electroconductive layer according to the present invention enhances the conversion efficiency of the lamination type photovoltaic device.

That is to say, it was confirmed that according to the sputtering method of the present invention, both a reactive sputtering method and a non-reactive sputtering method could be utilized. Consequently, the implementation of the method of forming a transparent electroconductive layer according to the present invention enhances the conversion efficiency of the lamination type photovoltaic device.

EXAMPLE 3

Figure 10A:
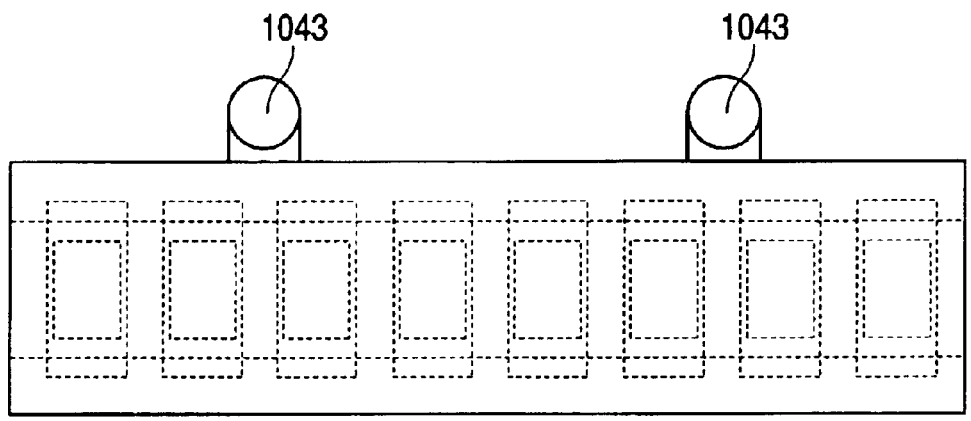
FIGS. 10A and 10B are schematic views each showing a manufacturing system for forming a transparent electroconductive layer of Example 3 of the present invention.
Figure 10B:
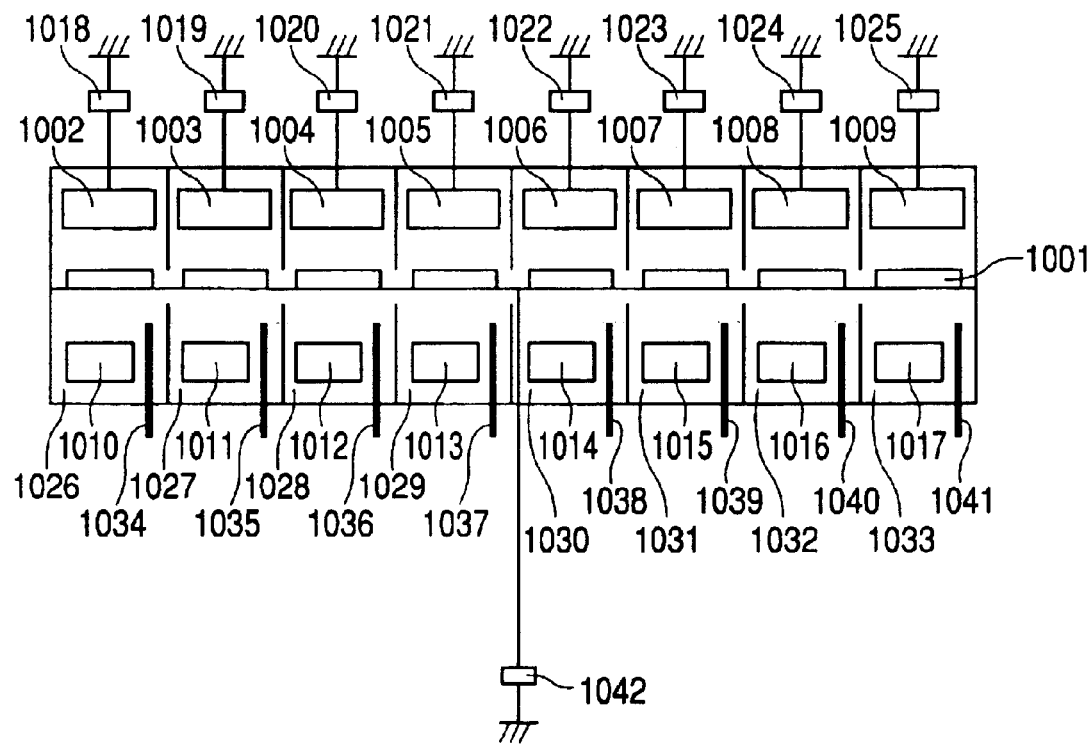

This example is different from Example 1 in that the first transparent electroconductive layer was formed using a batch processing sputtering system as shown in FIGS. 10A and 10B. Incidentally, FIG. 10A is a plan view, and FIG. 10B is a cross sectional view showing an inner construction of the system.

Similarly to Example 1, the first transparent electroconductive layer was formed while the bias potential was changed in the range of −150 V to 20 V to manufacture the lamination type photovoltaic device. The size of the substrate was 240 mm×356 mm, the inner area of the film forming chamber was 360 mm×680 mm, and the distance between the substrate and the target was 55 mm.

Figure 11:
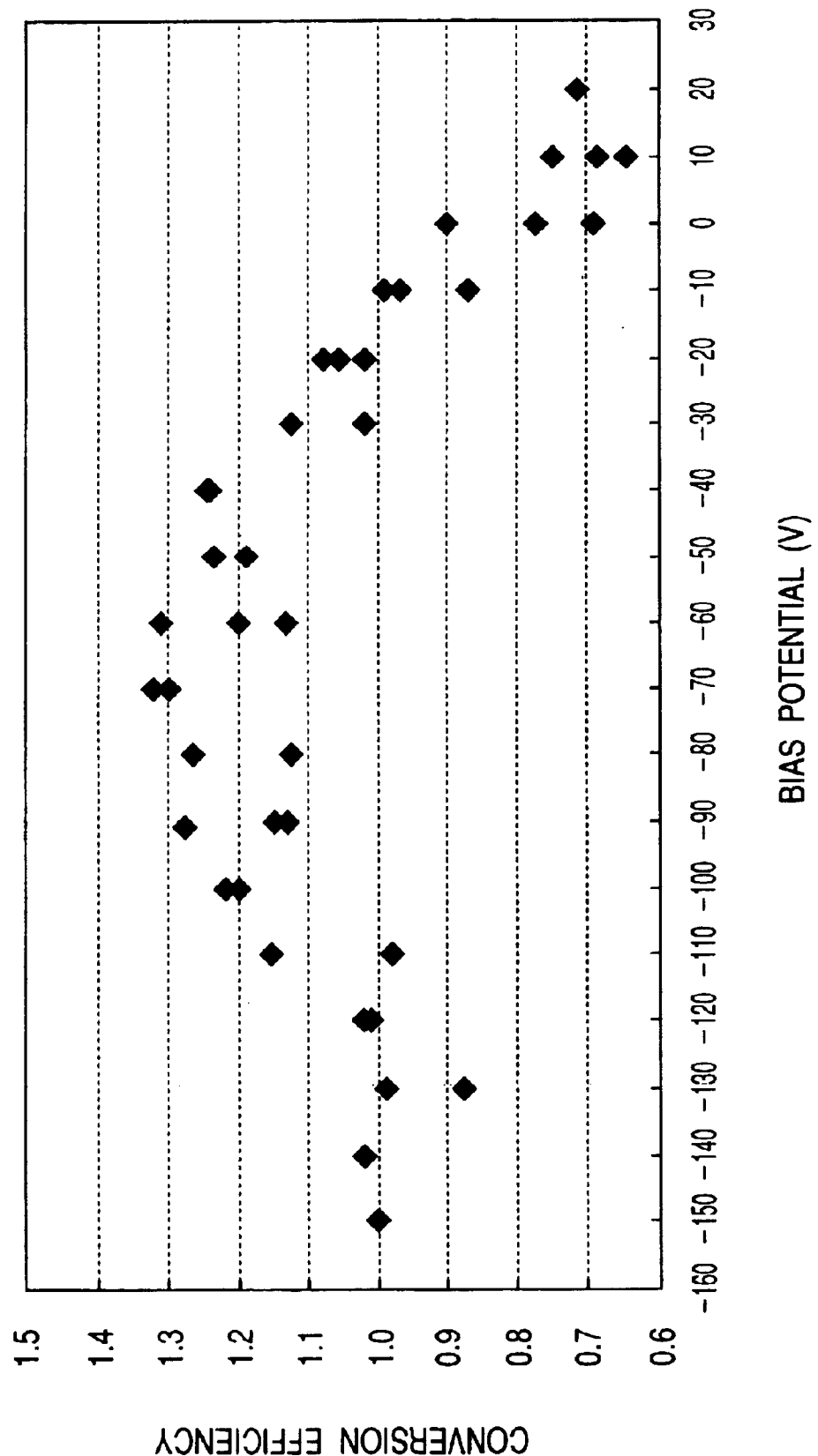
FIG. 11 is a graph showing the results of conversion efficiency characteristics of a lamination type photovoltaic device when a transparent electroconductive layer is formed by utilizing a batch processing film forming system of Example 3 of the present invention.
Figure 12:
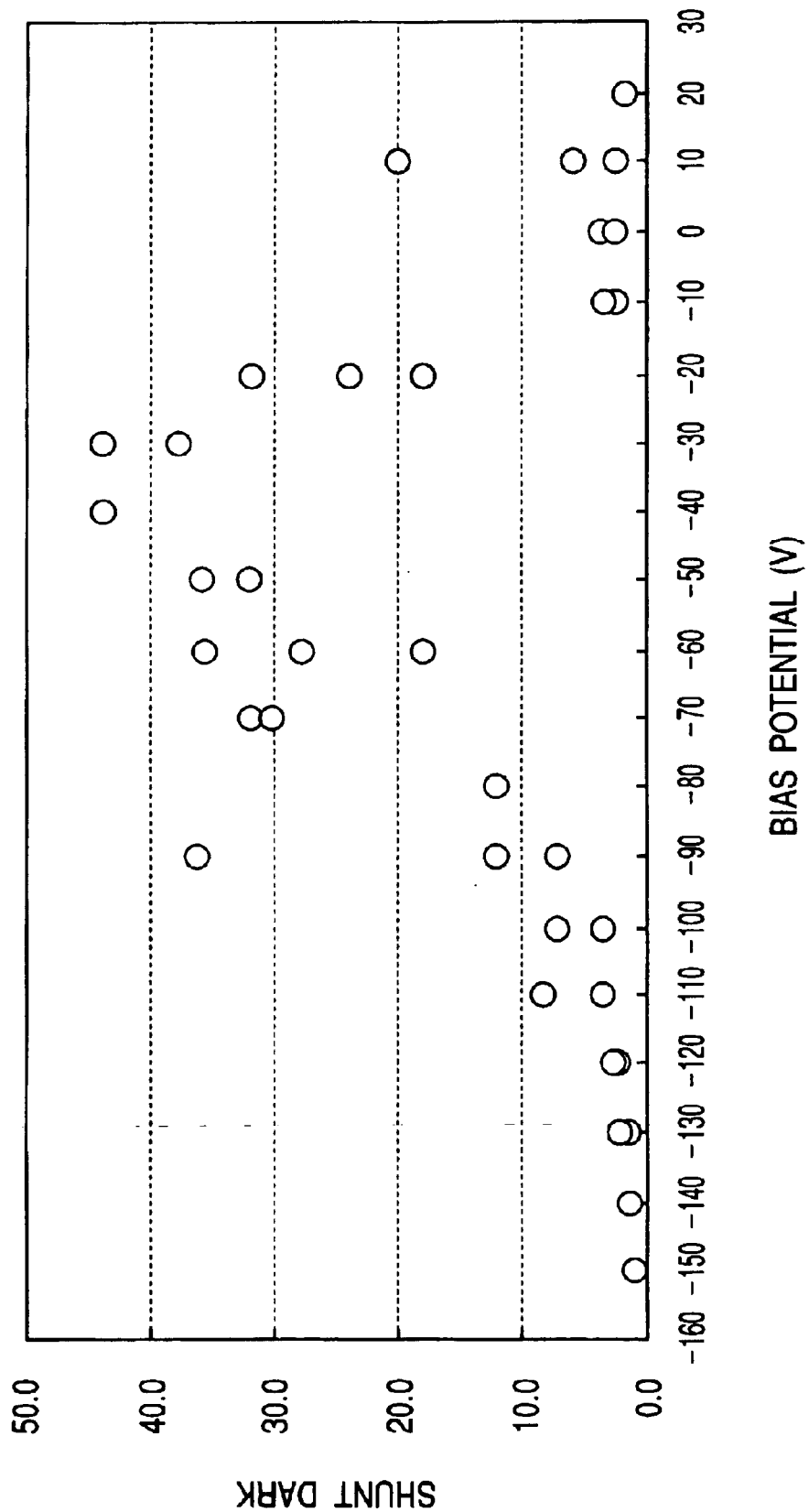
FIG. 12 is a graph showing the results of shunt dark characteristics of a lamination type photovoltaic device when a transparent electroconductive layer is formed by utilizing a batch processing film forming system of Example 3 of the present invention.

Then, the characteristics of the lamination type photovoltaic device were measured, and comparisons were made between the characteristics obtained when the bias potential of the substrate was changed in the range of −150 V to 200 V. Then, the resultant conversion efficiency characteristics, and the results of the shunt resistance of dark (RshDK) characteristics are shown in FIGS. 11 and 12, respectively. Note that, FIG. 11 shows relative values obtained when the conversion efficiency in case of the bias potential of −150 V is taken as 1, and FIG. 12 shows relative values obtained when the shunt dark in case of the bias potential of −150 V is taken as 1.

From the conversion efficiency characteristics of FIG. 11 and the results of the shunt dark (RshDK) characteristics of FIG. 12, it is understood that the range of −110 V to −20 V is the satisfactory range for the self-bias potential to be applied to the substrate. These results are the same as those of Example 1.

From the foregoing, it is understood that the implementation of the method of manufacturing the first transparent electroconductive layer according to the present invention enhances the conversion efficiency of the lamination type photovoltaic device.

That is to say, it was confirmed that according to the sputtering method of the present invention, both a roll-to-roll sputtering system and a batch processing sputtering system could be utilized. Consequently, the implementation of the method of forming a transparent electroconductive layer according to the present invention enhances the conversion efficiency of the lamination type photovoltaic device.

EXAMPLE 4

The characteristics of the lamination type photovoltaic device which was manufactured when an electrolytic passivation process was added to the process for manufacturing the lamination type photovoltaic device of Example 1 and the characteristics of the lamination type photovoltaic device which was manufactured when no electrolytic passivation process was added thereto were compared with each other. More specifically, there were measured the shunt dark (RshDK) when the treatment (electrolytic passivation) was executed in which after formation of the first transparent electroconductive layer, but before formation of the second semiconductor layer, the substrate having the first transparent electroconductive layer, the first semiconductor layer and the like formed thereon was dipped into $HNO_3$ solution (pH=3), and under this state, a voltage of 3.5 V was applied in the form of pulses (25 msec×100) to the substrate, and the shunt dark (RshDK) when such treatment was not executed. In addition, for a comparison, the same measurement was carried out for the lamination type photovoltaic device as well manufactured under the condition which is different from that of Example 1 in that the sputtering was carried out while the self-bias potential of the substrate was set to −10 V. The results are shown in Table 1.

Note that, RshDK and the conversion efficiency in Table 1 show relative values when the values of RshDK and the conversion efficiency are respectively taken as 1 in case where the lamination type photovoltaic device (2) was manufactured under the condition that no electrolytic passivation was conducted and the self-bias potential was set to −10 V.

As apparent from the results of measurement for the lamination type photovoltaic device (1) in Table 1, it is understood that the first transparent electroconductive layer is formed by utilizing the sputtering method adapted to control the bias potential of the substrate, and as a result the shunt dark (RshDK) is at a level which practically causes no problem. Also, the lamination type photovoltaic device (1) which was manufactured under the condition of the self-bias potential of −70 V shows the enhanced conversion efficiency as compared with the lamination type photovoltaic device (2) which was manufactured under the condition of the self-bias potential of −10 V.

In addition, as apparent from the results of measurement for the lamination type photovoltaic device (3) in Table 1, it is understood that in case where the electrolytic passivation is carried out, the more excellent RshDK is obtained (incidentally, the self-bias potential was −70 V). This is because parts of the transparent electroconductive layer overlying the defective areas were perfectly removed through the electrolytic passivation process.

Also, as apparent from the results of measurement for the lamination type photovoltaic device (4) in Table 1, it is understood that even when the self-bias potential was, −10

V, when only the electrolytic passivation was carried out, then the excellent RshDK was obtained.

TABLE 1

| Photovoltaic device | Electrolytic passivation | Self-bias potential of substrate | RshDK | Conversion efficiency |
|---|---|---|---|---|
| (1) | None | −70 | 1.04 | 1.22 |
| (2) |  | −10 | 1.00 | 1.00 |
| (3) | Yes | −70 | 5.63 | 1.27 |
| (4) |  | −10 | 1.50 | 1.11 |

Note that, RshDK and the conversion efficiency in Table 1 show relative values when the values of RshDK and the conversion efficiency are respectively taken as 1 in case where the lamination type photovoltaic device (2) was manufactured under the condition that no electrolytic passivation was conducted and the self-bias potential was set to −10 V.

What is claimed is:

1. A method of manufacturing a semiconductor device, comprising the steps of:
    forming a first semiconductor layer on a substrate;
    forming a first transparent electroconductive layer on the first semiconductor layer; and
    forming a second semiconductor layer on the first transparent electroconductive layer,
    the method further comprising executing passivation treatment on defects in the first semiconductor layer before the forming step of the second semiconductor layer.

2. The method of manufacturing a semiconductor device according to claim 1, wherein the passivation treatment is, by utilizing a sputtering method adapted to control a bias potential of the substrate, to form the first transparent electroconductive layer only on areas other than the defective areas in the first semiconductor layer.

3. The method of manufacturing a semiconductor device according to claim 1, wherein the passivation treatment is, after the forming step of the first transparent electroconductive layer, to passivate the first transparent electroconductive layer overlying the defective areas in the first semiconductor layer.

4. The method of manufacturing a semiconductor device according to claim 1, wherein the passivation treatment is, after the forming step of the first transparent electroconductive layer by utilizing a sputtering method adapted to control a bias potential of the substrate, to passivate the first transparent electroconductive layer overlying the defective areas in the first semiconductor layer.

5. The method of manufacturing a semiconductor device according to claim 3, wherein the passivation treatment is to remove the first transparent electroconductive layer overlying the defective areas in the first semiconductor layer.

6. The method of manufacturing a semiconductor device according to claim 3, wherein the passivation treatment is to increase the resistance of the first transparent electroconductive layer overlying the defective areas in the first semiconductor layer.

7. The method of manufacturing a semiconductor device according to claim 5, wherein the passivation treatment is executed by applying a voltage to the substrate.

8. The method of manufacturing a semiconductor device according to claim 5, wherein the passivation treatment is executed by applying a voltage to the substrate while the substrate is dipped into electrolyte.

9. A method of manufacturing a semiconductor device, comprising:
    forming a first semiconductor layer on a substrate;
    forming a first transparent electroconductive layer on the first semiconductor layer;
    forming a second semiconductor layer on the first transparent electroconductive layer; and
    forming a second transparent electroconductive layer on the second semiconductor layer,
    the method further comprising the steps of:
    executing passivation treatment on defects in the first semiconductor layer before formation of the second semiconductor layer; and
    executing passivation treatment on defects in the second semiconductor layer.

10. The method of manufacturing a semiconductor device according to claim 9, wherein the passivation treatment for the defects in the first semiconductor layer is, by utilizing a sputtering method adapted to control a bias potential of the substrate, to form the first transparent electroconductive layer only on areas other than the defective areas in the first semiconductor layer, and
    the passivation treatment for the defects in the second semiconductor layer is, by utilizing a sputtering method adapted to control a bias potential of the substrate, to form the second electroconductive layer only on areas other than the defective areas in the second semiconductor layer.

11. The method of manufacturing a semiconductor device according to claim 9, wherein the passivation treatment for the defects in the first semiconductor layer is, by utilizing a sputtering method adapted to control a bias potential of the substrate, to form the first transparent electroconductive layer only on areas other than the defective areas in the first semiconductor layer, and
    the passivation treatment for the defects in the second semiconductor layer is, after the formation of the second transparent electroconductive layer, to passivate the second electroconductive layer overlying the defective areas in the second semiconductor layer.

12. The method of manufacturing a semiconductor device according to claim 9, wherein the passivation treatment for the defects in the first semiconductor layer is, by utilizing a sputtering method adapted to control a bias potential of the substrate, to form the first transparent electroconductive layer only on areas other than the defective areas in the first semiconductor layer, and
    the passivation treatment for the defects in the second semiconductor layer is, after the formation of the second transparent electroconductive layer by utilizing a sputtering method adapted to control a bias potential of the substrate, to passivate the second electroconductive layer overlying the defective areas in the second semiconductor layer.

13. The method of manufacturing a semiconductor device according to claim 9, wherein the passivation treatment for the defects in the first semiconductor layer is, after the forming step of the first transparent electroconductive layer, to passivate the first transparent electroconductive layer overlying the defective areas in the first semiconductor layer, and
    the passivation treatment for the defects in the second semiconductor layer is, by utilizing a sputtering method adapted to control a bias potential of the substrate, to form the second electroconductive layer only on areas other than the defective areas in the second semiconductor layer.

14. The method of manufacturing a semiconductor device according to claim 9, wherein the passivation treatment for the defects in the first semiconductor layer is, after the forming step of the first transparent electroconductive layer, to passivate the first transparent electroconductive layer overlying the defective areas in the first semiconductor layer, and the passivation treatment for the defects in the second semiconductor layer is, after the forming step of the second transparent electroconductive layer, to passivate the second electroconductive layer overlying the defective areas in the second semiconductor layer.

15. The method of manufacturing a semiconductor device according to claim 9, wherein the passivation treatment for the defects in the first semiconductor layer is, after the forming step of the first transparent electroconductive layer, to passivate the first transparent electroconductive layer overlying the defective areas in the first semiconductor layer, and the passivation treatment for the defects in the second semiconductor layer is, after the second transparent electroconductive layer is formed by utilizing a sputtering method adapted to control a bias potential of the substrate, to passivate the second electroconductive layer overlying the defective areas in the second semiconductor layer.

16. The method of manufacturing a semiconductor device according to claim 9, wherein the passivation treatment for the defects in the first semiconductor layer is, after the first transparent electroconductive layer is formed by utilizing a sputtering method adapted to control a bias potential of the substrate, to passivate the first transparent electroconductive layer overlying the defective areas in the first semiconductor layer, and the passivation treatment for the defects in the second semiconductor layer is, by utilizing a sputtering method adapted to control a bias potential of the substrate, to form the second electroconductive layer overlying the defective areas in the second semiconductor layer.

17. The method of manufacturing a semiconductor device according to claim 9, wherein the passivation treatment for the defects in the first semiconductor layer is, after the first transparent electroconductive layer is formed by utilizing a sputtering method adapted to control a bias potential of the substrate, to passivate the first transparent electroconductive layer overlying the defective areas in the first semiconductor layer, and the passivation treatment for the defects in the second semiconductor layer is, after the forming step of the second transparent electroconductive layer, to passivate the second electroconductive layer overlying the defective areas in the second semiconductor layer.

18. The method of manufacturing a semiconductor device according to claim 9, wherein the passivation treatment for the defects in the first semiconductor layer is, after the first transparent electroconductive layer is formed by utilizing a sputtering method adapted to control a bias potential of the substrate, to passivate the first transparent electroconductive layer overlying the defective areas in the first semiconductor layer, and the passivation treatment for the defects in the second semiconductor layer is, after the second transparent electroconductive layer is formed by utilizing a sputtering method adapted to control a bias potential of the substrate, to passivate the second electroconductive layer overlying the defective areas in the second semiconductor layer.

19. The method of manufacturing a semiconductor device according to claim 2, wherein in the sputtering method adapted to control a bias potential of a substrate, a voltage is applied from a first power supply to a target, and a voltage is applied from a second power supply to the substrate, to control the bias potentials independently of each other.

20. A method of manufacturing a semiconductor device, comprising the steps of:

forming a first semiconductor layer on a substrate;

forming a first transparent electroconductive layer on the first semiconductor layer, and forming a second semiconductor layer on the first transparent electroconductive layer; in this order, wherein the forming step of the first transparent electroconductive layer is carried out by the process comprising the steps of:

charging the substrate having the first semiconductor layer thereon to a negative potential;

applying ions to a sputtering target while the substrate is charged to the negative potential; and forming a sputtering film on the first semiconductor layer as a first transparent electroconductive layer.

21. A semiconductor device, comprising at least:

a substrate;

a first semiconductor layer formed on the substrate and having defective areas;

a first transparent electroconductive layer formed on areas other than the defective areas of the first semiconductor layer; and a second semiconductor layer formed on the first transparent electroconductive layer.

* * * * *